United States Patent [19]

Suzuki

[11] 3,904,979

[45] Sept. 9, 1975

[54] PROTECTIVE CIRCUIT FOR TRANSISTOR AMPLIFIER

[75] Inventor: Tadao Suzuki, Tokyo, Japan

[73] Assignee: Sony Corporation, Tokyo, Japan

[22] Filed: July 24, 1973

[21] Appl. No.: 382,139

[30] Foreign Application Priority Data

July 27, 1972 Japan ................................ 47-75414

[52] U.S. Cl. ............... 330/207 P; 307/202; 317/33; 330/15; 330/17

[51] Int. Cl. .......................... H03f 21/00; H02h 7/00

[58] Field of Search ......... 307/202; 317/33; 330/15, 330/17, 207 P

[56] References Cited

UNITED STATES PATENTS 3,364,391 1/1968 Jensen ............................... 317/33 R 3,536,958 10/1970 Sondermeyer .................... 317/33 R 3,681,659 8/1972 Suzuki .......................... 330/207 P X

*Primary Examiner*—R. V. Rolinec

*Assistant Examiner*—Lawrence J. Dahl

*Attorney, Agent, or Firm*—Hill, Gross, Simpson, Van Santen, Steadman, Chiara & Simpson

[57] ABSTRACT

A protective circuit for a transistor amplifier is provided by measuring the load impedance and actuating a protective means across an input terminal of the transistor amplifier when a measured value of said load impedance becomes lower than a predetermined value, to thereby protect an overload of said transistor amplifier. The protective circuit is applicable for a class B push-pull amplifier and, particularly effective to protect the overload without misoperation when the load of said amplifier has a reactance component.

9 Claims, 12 Drawing Figures

PROTECTIVE CIRCUIT FOR TRANSISTOR AMPLIFIER

BACKGROUND OF THE INVENTION

1. Field of the Invention

The present invention relates generally to a protective circuit for a transistor amplifier, and more particularly to a protective circuit for a transistor amplifier which is effective when used for protecting the amplifier against a fall in an impedance load below some predetermined critical point.

2. Description of the Prior Art

In a conventional protective circuit for a transistor amplifier, a protective line for the characteristic between the collector-emitter voltage $V_{CE}$ and the collector current $I_C$ of a transistor to be protected can be indicated by a line 1 shown in FIG. 1. In the case where a load is a pure resistor or one similar to a resistor for such a protective characteristic, a load line can be indicated by a line 2 in FIG. 1, so that a normal protective operation can be carried out. However, in the case where the load includes a reactance component, such as a condenser speaker, the load line becomes an ellipse 3 as shown in FIG. 1 and thus the load line of the ellipse 3 intersects with the protective line 1 with the result that the protective operation is also carried out for other than an overload. In such a case, since even if the load line becomes the ellipse 3, the ellipse 3 exceeds the tolerable collector loss of a transistor at instant, the transistor is not damaged in practice. In other words, in the case of the impedance load, the transistor is not broken even if the load line 3 becomes an ellipse to cross the protective line 1, but the protective circuit operates, namely the protective circuit achieves an error operation.

SUMMARY OF THE INVENTION

It is an object of this invention to provide a protective circuit for a transistor amplifier which avoids an error operation when an impedance load is used.

It is another object of this invention to provide a protective circuit for a transistor amplifier which performs its protective operation when a load impedance is lower than a predetermined value.

It is a further object of this invention to provide a protective circuit for a transistor amplifier which is effective when it is used for a class B push-pull amplifier.

It is a further object of this invention to provide a protective circuit for a transistor amplifier which has a first rectifier circuit for rectifying a voltage in association with a load current, a second rectifier circuit for rectifying a voltage in association with a load voltage, a capacitor supplied with the output from the first and second rectifier circuits in opposite polarities and a protective circuit controlled with the terminal voltage across the capacitor.

It is a further object of this invention to provide a protective circuit for a transistor amplifier in which an input signal applied thereto is muted when the detected output from a load impedance detector circuit is lower than a predetermined value.

It is a yet further object of this invention to provide a protective circuit for a transistor amplifier in which a bias current therefor is controlled when the detected output from a load impedance detector circuit is lower than a predetermined value.

The additional and other objects, features and advantages of this invention will become apparent from the following description taken in conjunction with the accompanying drawings.

DESCRIPTION OF THE PREFERRED EMBODIMENTS

A description will be hereinbelow given on an example in which the present invention is applied to a class B push-pull power amplifier with positive and negative electric power sources.

Figure 2:
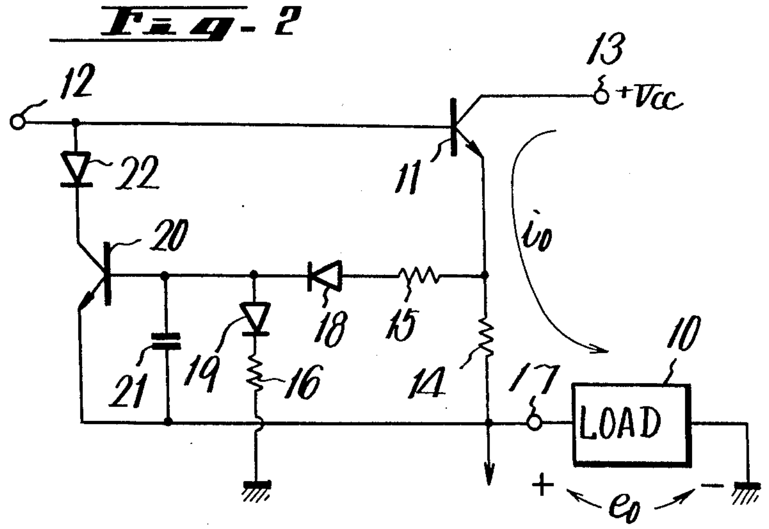
FIG. 2 is a basic circuit diagram of an example of a protective circuit for a transistor amplifier according to the present invention.

FIG. 2 shows the case where the present invention is applied to one side of class B push-pull transistor amplifier which amplifies a positive half of an input signal. In FIG. 2, reference numeral 11 is an output transistor to be protected, the base electrode of which is supplied with an input signal through a terminal 12 from a driving stage (not shown), and with a base bias. The collector electrode of the output transistor 11 is connected to a positive power source terminal 13 of +Vcc, and its emitter electrode is connected through a resistor 14 for detecting a load current to an output terminal 17 which is grounded through a load 10. The emitter electrode of the output transistor 11 is further connected through a series connection of a resistor 15 and a diode 18 for rectifying a peak value to the base electrode of a switching transistor 20. The base electrode of the switching transistor 20 is also connected through a capacitor 21 to the output terminal 17 and is grounded through a series connection of a diode 19 for rectifying a peak value and a resistor 16. The emitter electrode of the transistor 20 is connected to the terminal 17, and the collector electrode thereof is connected to the base electrode of the output transistor 11 through a diode 22 for preventing a reverse voltage.

Figure 3:
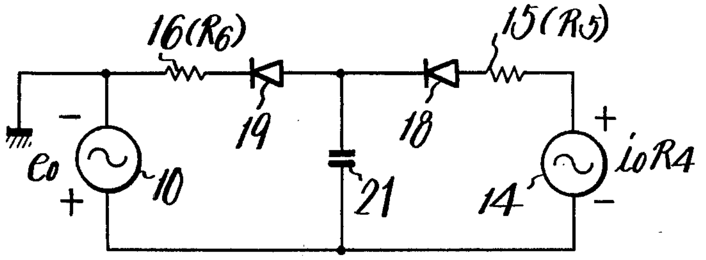
FIGS. 3 and 4 are respectively equivalent circuits used for explaining the basic circuit of the invention.

With such a circuit construction, if it is assumed that the collector current of the transistor 11 or a load current flowing through the resistor 14 to the load 10 is taken as $i_0$; a load voltage across the load 10 as $e_0$; and the resistance values of the resistors 14, 15 and 16 as $R_4$, $R_5$, and $R_6$, respectively, the equivalent circuit to the circuit of FIG. 2 can be shown as in FIG. 3. That is to say, the resistor 14 can be deemed as a voltage source 14 with the voltage of $i_0R_4$ and the load 10 as a voltage source 10 with the voltage of $e_0$. Thus, the capacitor 21 is charged up with the output from the voltage source 14 but discharged with the output from the voltage source 10. In other words, the voltages $i_0R_4$ and $e_0$ are rectified in peak value by the diodes 18 and 19, respectively, and then applied to the capacitor 21 in opposite polarities.

Figure 4:
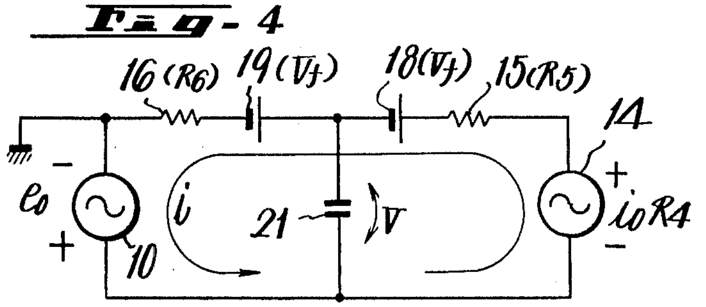

If the resistance in the forward direction of the diodes 18 and 19 is neglected and their voltage drop in the forward direction is taken as $V_f$, the equivalent circuit of FIG. 3 can be further replaced as shown in FIG. 4. In this case, if it is taken that a current flowing through the equivalent circuit of FIG. 4 is $i$; a terminal voltage across the capacitor 21 is V; the peak value of the current $i_0$ is $i_p$; and the peak value of the voltage $e_0$ is $e_p$ when the circuit of FIG. 4 is in stationary state, the following equations are established:

$$V = R_4 i_p - R_5 i - V_f \quad (1)$$

$$V = V_f + R_6 i - e_p \quad (2)$$

If the term i is cancelled from the equations (1) and (2), the following equation (3) is derived:

$$V = \frac{1}{R_5 + R_6}\left[R_4 R_6 i_p - R_5 e_p + (R_5 - R_6) V_f\right] \quad (3)$$

When the voltage V becomes larger than the voltage drop across the base-emitter of the transistor 20, the transistor 20 becomes conductive to protect the output transistor 11.

If $V = V_{BE} = V_f$, the following equation (4) is obtained from the equation (3):

$$i_p = \frac{R_5 e_p}{R_4 R_6} + \frac{2V_f}{R_4} \quad (4)$$

In this case, $e_p/i_p = Z$ is assumed. In other words, the voltages $i_0 R_4$ and $e_0$ are rectified in peak value by the diode 18 and 19, respectively, and then converted to a DC voltage V through the capacitor 21, so that the terminal voltage V of the capacitor 21 is irrespective of the phase shifts of the current $i_0$ and the voltage $e_0$ but depends upon the peak values $i_p$ and $e_p$. Accordingly, $Z = e_p/i_p$ shows not only the pure resistance of the load 10 but also its impedance component.

If $Z = e_p/i_p$ is placed in the equation (4), the following equation (5) can be obtained:

$$i_p = \frac{2V_f R_6}{R_4 R_6 - R_5 Z} \quad (5)$$

If the value of the load impedance $Z\infty$ is calculated from the equation (5) when $i_p = \infty$ (infinity) is satisfied, the following equation (6) is derived:

$$Z\infty = \frac{R_4 R_6}{R_5} \quad (6)$$

Accordingly, if the load impedance Z is greater than that obtained from the equation (6), the current $i_p$ becomes negative with the result that the transistor 20 is not made conductive. However, in the case where the load impedance Z is smaller than $Z\infty$, when the peak current is greater than $i_p$ shown by the equation (5), the transistor 20 is made conductive to protect the transistor 11.

Figure 5:
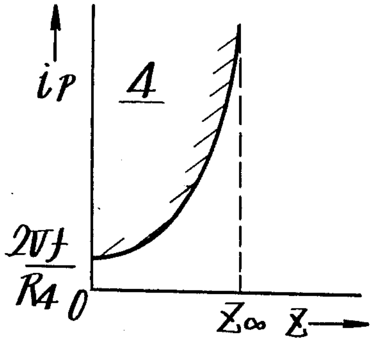

If a plot is made based upon the equation (5), thr graph shown in FIG. 5 is obtained. A region or area 4 in FIG. 5 shows a protective or restricted region in which the transistor 20 becomes conductive to protect thr transistor 11. As apparent from the graph of FIG. 5, when $Z = 0$ or the load is short-circuited, the peak current $i_p$ becomes $2V_f/R_4$ which is the minimum value. Accordingly, if the transistor 11 is designed such that the value of its heat generation does not exceed its tolerance value at the current value of $2V_f/R_4$, the transistor 11 is protected for the continuous short-circuiting of the load.

Figure 1:
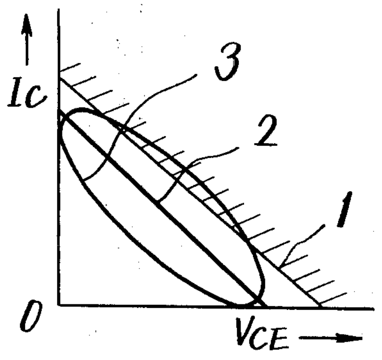
FIG. 1 (PRIOR ART)
FIG. 1 is a graph for showing the control characteristic of a conventional protective circuit for a transistor amplifier.
Figure 6:
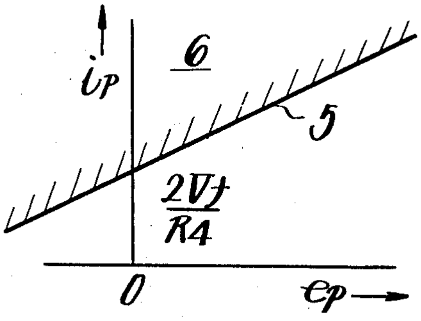
FIGS. 5 to 8, inclusive, are respectively graphs used for explaining the operation characteristics of the protective circuit of the invention.

FIG. 6 shows a graph which is obtained by plotting in accordance with the equation (4). In this case, if the voltage drop across the resistor 14 is neglected, the sum of the collector-emitter voltage $V_{CE}$ of the transistor 11 and the load voltage $e_0$ is that Vcc of the voltage source and the load current $i_0$ is equal to the collector current of the transistor 11. Accordingly, if the equation (4) is shown on the characteristic graph between the $V_{CE}$ and $I_C$ of the transistor 11, a graph shown in FIG. 7 is obtained.

Figure 7:
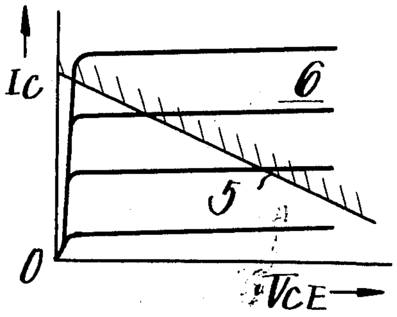
Figure 8:
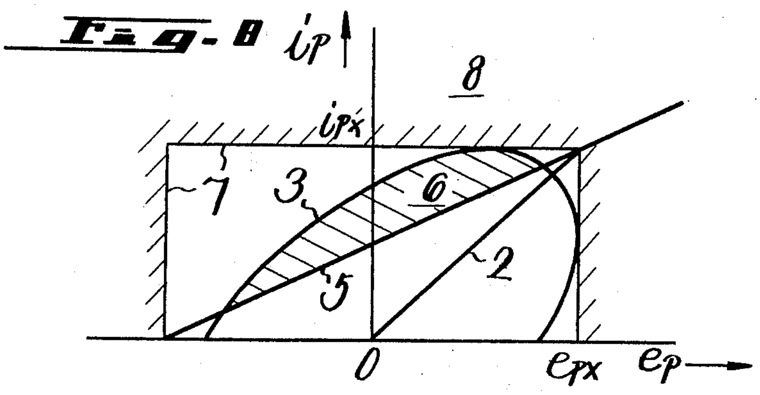

If the load 10 is a pure resistance element, lines 5 in FIGS. 6 to 8 show a protective or restricted line and regions or areas 6 show a protective or restricted regions, respectively. While, if the load 10 is an impedance element, a broken line 7 in FIG. 8 shows an apparent protective or restricted line and a region 8 in FIG. 8 is a protective or restricted region. Since the terminal voltage V of the capacitor 21 relates to the peak current $i_p$ and the peak voltage $e_p$ as mentioned above, if a load line ($e_p$ versus $i_p$ characteristic) is shown by the line 2 in FIG. 8 in the case where the load is the pure resistor with the resistance value equal to the impedance of the load impedance, the values $i_{p,r}$ and $e_{p,r}$ of the current $i_p$ and the voltage $i_p$ at the cross point X of the line 2 with the protective or restricted line 5 correspond to a region within which an output can be derived. While, in the case of the impedance load, even if its load line becomes the ellipse 3 (in FIG. 8 only a positive half cycle is shown) and it intersects with the protective or restricted line 5, no protective operation is carried out, but the protective operation is performed only when the ellipse 3 intersects with the broken line 7. Accordingly, even in the case of the impedance load, if the impedance is higher than a tolerance value in correspondence with the broken line 7, an output can be delivered without being used for over protection. In FIG. 8 the positive half cycle only is shown and the protective operation for the positive half cycle is described but it will be apparent that the protective operation is similarly performed for the negative half cycle as in the positive half cycle.

Figure 9:
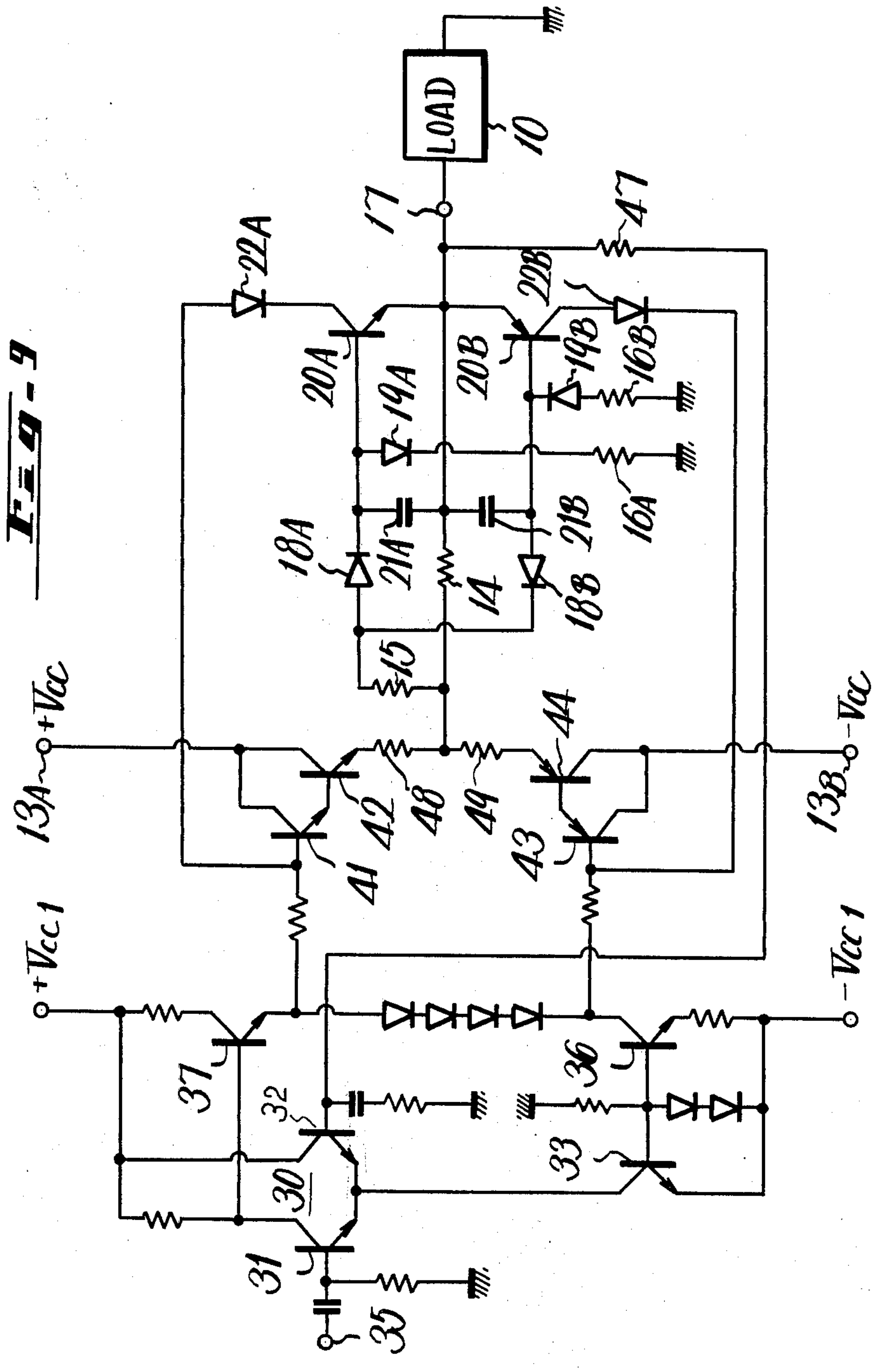
FIG. 9 is a circuit diagram of a class B push-pull amplifier in which the protective circuit for a transistor amplifier of the invention is employed.

FIG. 9 shows the case where the protective circuit of the present invention is applied to the class B output stage of a power amplifier. In FIG. 9, reference numeral 30 designates a differential amplifier which consists of a pair of transistors 31 and 32 for amplification and a transistor 33 for constant current. An input signal fed to an input terminal 35 is applied to the base electrode of the transistor 31. The collector output of the transistor 31 is fed through a transistor 37, which is connected as an emitter follower type by a transistor 36 for constant current, to transistors 41, 42 and 43, 44 which are connected as an SEPP (single-ended-push-pull) type. In this case, the transistors 41 and 42 are connected in the Darlington manner and the transistors 43 and 44 are also connected in the Darlington manner. The emitter output of the transistor 37 is supplied to the base electrode of the transistors 41 and 43, respectively. The collector electrodes of the transistors 41 and 42 are connected together to a positive electric power source terminal 13A of +Vcc, while the collector electrodes of the transistors 43 and 44 are connected together to a negative electric power source terminal 13B of −Vcc. A series connection of resistors 48 and 49 is connected between the emitter electrodes of the transistors 42 and 44 and an output is derived from the connection point between the resistors 48 and 49.

A protective circuit for the transistors 41 and 42 is constructed as described below. The connection point between the resistors 48 and 49 is connected through the resistor 14 for detecting the load current to the output terminal 17 and also connected through a series connection of the resistor 15 and the diode 18A to the base electrode of a transistor 20A. The base electrode of the transistor 20A is further connected through a capacitor 21A to the output terminal 17 and also grounded through a series connection of the diode 19A and the resistor 16A. The emitter electrode of the transistor 20A is connected to the output terminal 17, while its collector electrode is connected through a diode 22A to the base electrode of the transistor 41.

A protective circuit for the transistors 43 and 44 is constructed similarly, so that its components are indicated in FIG. 9 by the same reference numerals with a letter B instead of the letter A of the protective circuit for the transistors 41 and 42 and their description will be omitted. In FIG. 9, reference numeral 47 indicates a feedback resistor connected between the output terminal 17 and the base electrode of the transistor 32.

The protective circuits for the transistors 41, 42 and 43, 44 shown in FIG. 9 perform the same protective operation described in connection with FIGS. 2 to 8, so that the detailed description of their protective operation will be omitted. However, when the impedance value of the load 10 becomes lower than the predetermined value, the transistors 20A and 20B become conductive to control the base currents of the transistors 41 and 43 and the input signal and hence to avoid the overload of the transistors 41, 42, 43 and 44.

In the example of FIG. 9, the transistors 20A and 20B in the protective circuits are connected so as to control the base currents of the transistors 41, 42, 43 and 44 and the input signal simultaneously, but it may be possible, by way of example, that the transistors are connected between the base electrode of the transistor 31, which forms a pre-amplifier, and a reference potential to mute the input signal only.

In the basic circuit of the invention shown in FIG. 2, when the load is short-circuited, a short-circuiting current of $2V_f/R_4$ flows. In order to reduce the short-circuiting current, it may be enough to increase the resistance value of the resistor 14, but the increase of the resistance value causes a power loss across the resistor 14. To avoid this defect, it may be considered that the transistor 20 and the diode 18 are both formed of germanium to reduce $V_f$ and hence the short-circuiting current, but there is a limit in the reduction of the short-circuiting current by this method.

Figure 10:
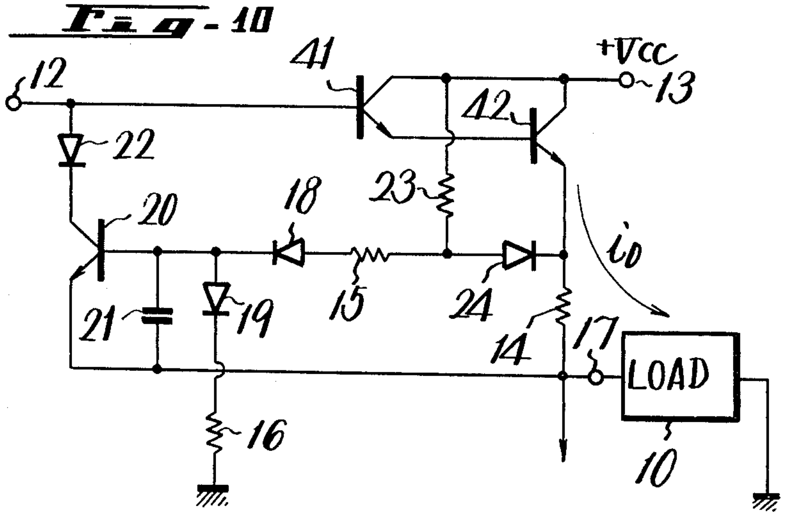
FIGS. 10 to 12, inclusive, are respectively circuit diagrams for showing other examples of the invention.
Figure 11:
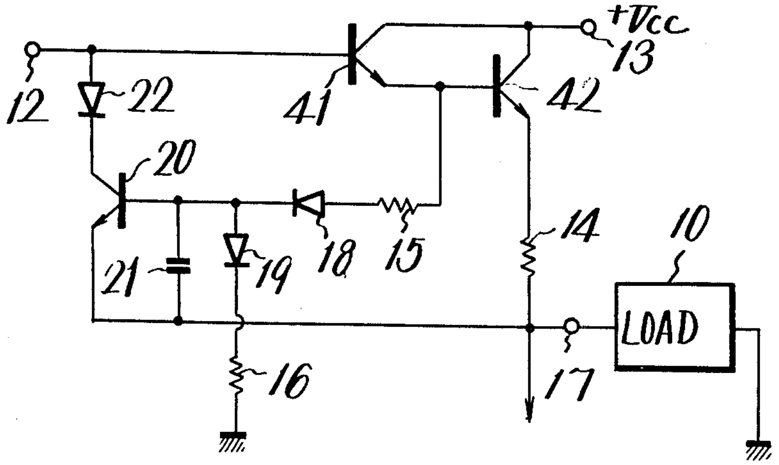

FIGS. 10 and 11 respectively show other examples of the present invention in which reference numerals the same as those of FIG. 2 indicate the same elements and which can reduce the short-circuiting current. In these examples, a bias is applied to the circuit for detecting the load current $i_0$ to reduce the short-circuiting current.

FIG. 10 shows the case where a positive half cycle of a class B output stage is dealt with as in the case of FIG. 2. In this case, the transistors 41 and 42 are connected in the Darlington manner, a series connection of a resistor 23 and a diode 24 is connected between the collector-emitter of the transistor 42 and the connection point between the resistor 23 and the diode 24 is connected to the resistor 15. Accordingly, the voltage $i_0R_4$ produced across the resistor 14 becomes high by a voltage drop across the diode 24 and hence $2V_f$ of the short-circuiting current $2V_f/R_4$ is reduced by the above voltage drop. Thus, the short-circuiting current $2V_f/R_4$ is reduced so much.

In the example of FIG. 11, the resistor 15 is connected to the transistor 42 at its base electrode, so that the voltage between the base-emitter of the transistor 42 serves the same as the voltage drop across the diode 24 in the example of FIG. 10 to reduce the short-circuiting current, similarly.

Figure 12:
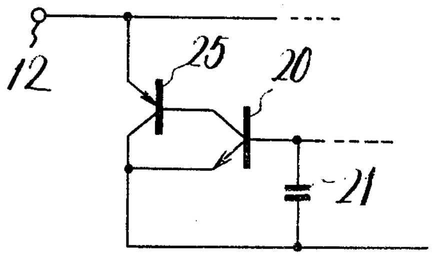

It is possible in the foregoing examples, that, in place of the diode 22, a transistor 25 is connected to the transistor 20 in an inverted Darlington manner as shown in FIG. 12.

It may be apparent that many modifications and variations may be effected without departing from the spirit and scope of the novel concepts of the present invention.

I claim as my invention:

1. A protective circuit for a transistor amplifier comprising:

a. an amplifying stage including first and second opposite conductivity transistors each having base, emitter and collector electrodes and connected in series across a voltage source;

b. a signal input circuit coupled to the base electrodes of said transistors;

c. an output terminal connected to the connection point between said first and second transistors;

d. a load connected between said output terminal and a reference point through a first resistor;

e. a first diode and a first capacitor connected in series across said first resistor;

f. a second diode connected with the same polarity with respect to said first diode between the connection point of said first diode with said first capacitor and said reference point;

g. a third diode and a second capacitor connected in series across said first resistor, the polarity of said third diode being opposite in polarity with respect to said first diode;

h. a fourth diode connected with the same polarity with respect to said third diode between the connection point of said third diode between the connection point of said third diode with said second capacitor and said reference point;

i. a third transistor the base and emitter electrodes of which are connected across said first capacitor and the collector electrodes of which is connected to the base electrode of said first transistor; and j. a fourth transistor the base and emitter electrodes of which are connected across said second capacitor and the collector electrode of which is connected to the base electrode of said second transistor.

2. A protective circuit for a transistor amplifier as claimed in claim 1, further including a driver stage having input and output terminals the output signal from which is applied across the base electrodes of said first and second transistors, and a pre-amplifying stage having input and output terminals to the input terminal of which an input signal is applied and an output signal of which is applied to said input terminal of said driver stage.

3. A protective circuit for a transistor amplifier comprising:

a. first and second transistors each of which has base, emitter and collector electrodes and which are connected between electric power sources in series with opposite polarities;

b. a signal input circuit coupled to the base electrodes of said first and second transistors;

c. an output terminal connected to the connection point between said first and second transistors;

d. a load connected through a first resistor between said output terminal and a reference point;

e. a series connection of a second resistor and a first diode, said series connection being connected in parallel between the collector and emitter electrodes of said first transistor, said first diode being connected with the same polarity with respect to said first transistor;

f. a series connection of a second diode and a first capacitor connected in parallel between the connection point of said second resistor with said first diode and the connection point of said first resistor with said load, the anode of said second diode being commonly connected to the anode of said first diode;

g. a third diode connected between the connection point of said second diode with said first capacitor and the reference point, the anode of said third diode being connected commonly to the cathode of said second diode;

h. a third transistor having base, emitter and collector electrodes the base and emitter electrodes of which are connected in parallel to said first capacitor and the collector electrode of which is connected to the base electrode of said first transistor;

i. a series connection of a third resistor and a fourth diode connected between the collector and emitter electrodes of said second transistor, said fourth diode being connected with the same polarity as that of said second transistor;

j. a series connection of a fifth diode and a second capacitor connected between the connection point of said third resistor with said fourth diode and the connection point of said first resistor with said load, the cathode of said fifth diode being connected commonly to the cathode of said fourth diode;

k. a sixth diode connected between the connection point of said fifth diode with said second capacitor and the reference point, the cathode of said sixth diode being connected commonly to the anode of said fifth diode; and l. a fourth transistor having base, emitter and collector electrodes the base and emitter electrodes of which are connected in parallel to said second capacitor and the collector electrode of which is connected to the base of said second transistor.

4. A protective circuit for a transistor amplifier comprising:

a. first and second transistors each of which has base, emitter and collector electrodes and which are connected between electric power sources in series with opposite polarities;

b. a signal input circuit coupled to the base electrodes of said first and second transistors;

c. an output terminal connected to the connection point between said first and second transistors;

d. a load connected through a first resistor between said output terminal and a reference point;

e. a series connection of a first diode and a first capacitor said series connection being connected between the base electrode of said first transistor and the connection point of said first resistor with said load, the anode of said first diode being connected to the base electrode of said first transistor;

f. a second diode the anode of which is connected to the cathode of said first diode and the cathode of which is connected to said reference point;

g. a third transistor having base, emitter and collector electrodes the base and emitter electrodes of which are connected in parallel to said first capacitor and the collector electrode of which is connected to the base electrode of said first transistor;

h. a series connection of a third diode and a second capacitor connected between the base electrode of said first transistor and the connection point of said first resistor with said load, the cathode of said third diode being connected to the base electrode of said second transistor;

i. a fourth diode the cathode of which is connected to the anode of said third diode and the anode of which is connected to said reference point; and j. a fourth transistor having base, emitter and collector electrodes the base and emitter electrodes of which are connected in parallel to said second capacitor and the collector electrode of which is connected to the base electrode of said second transistor.

5. A protective circuit for a transistor amplifier comprising:

a. a DC voltage source;

b. a first transistor having first, second and third electrodes, said first electrode supplied with an input signal to be amplified and said second electrode connected to said DC voltage source;

c. a first resistor, d. a load connected between said third electrode of said first transistor and a reference point through said first resistor;

e. a first capacitor;

f. first circuit means including a first diode and a second resistor connected in series between said one side of said first capacitor and one side of said first resistor to supply a first DC voltage in proportion to a voltage across said first resistor to said first capacitor with one polarity;

g. second circuit means including a second diode and a third resistor connected in series between said one side of said first capacitor and said reference point to supply a second DC voltage in proportion to a voltage across said load to said first capacitor with the other polarity;

h. detecting means comprising a second transistor having first second and third electrodes, a third diode connected to said third electrode, said first and second electrodes of said second transistor connected across said first capacitor respectively, said third diode connected to said first electrode of said first transistor, and operative to substantially reduce the amplification of said first transistor in response to the voltage across said first capacitor.

6. A protective circuit for a transistor amplifier comprising:

a. a DC voltage source;

b. a first transistor having first, second and third electrodes, said first electrode supplied with an input signal to be amplified and said second electrode connected to said DC voltage source;

c. a first resistor, a load connected between said third electrode of said first transistor and a reference point through said first resistor;

e. a first capacitor having a pair of terminals;

f. first circuit means including a first diode and a second resistor connected in series between one terminal of said first capacitor and said first electrode of said first transistor, the other terminal of said first capacitor connected to a connection point of said first resistor and said load, and said first circuit means supplying a first DC voltage in proportion to a voltage across said first resistor to said first capacitor with one polarity;

g. second circuit means including a second diode and a third resistor connected in series between said one terminal of said first capacitor and said reference point for supplying a second DC voltage in proportion to a voltage across said load to said first capacitor with the other polarity;

h. detecting means comprising a second transistor having first second and third electrodes, a third diode connected to said third electrode, said first and second electrodes of said second transistor connected across said first capacitor respectively, said third diode connected to said first electrode of said first transistor, and operative to substantially reduce the amplification of said first transistor in response to the voltage across said first capacitor.

7. A protective circuit for a transistor amplifier according to claim 6, further including a second transistor having first, second and third electrodes and connected to said first transistor with a Darlington configuration.

8. A protective circuit for a transistor amplifier comprising:

a. a DC voltage source;

b. a first transistor having first, second and third electrodes, said first electrode supplied with an input signal to be amplified and said second electrode connected to said DC voltage source;

c. a load connected between said third electrode of said first transistor and a reference point through a first resistor;

d. a first capacitor;

e. first circuit means including first and second diodes, second and third resistors, said first diode and second resistor connected in series between one side of said capacitor and one side of said second diode, to supply a first DC voltage in proportion to a voltage across said first resistor to said first capacitor with one polarity, said second diode and third resistor connected in series between said DC voltage source and said third electrode of said first transistor;

f. second circuit means including a third diode and fourth resistor each connected in series between said one side of said capacitor and said reference point to supply a second DC voltage in proportion to a voltage across said load to said first capacitor with the other polarity;

g. detecting means comprising a second transistor having first second and third electrodes, a third diode connected to said third electrode, said first and second electrodes of said second transistor connected across said first capacitor respectively, said third diode connected to said first electrode of said first transistor, and operative to substantially reduce the amplification of said first transistor in response to the voltage across said first capacitor.

9. A protective circuit for a transistor amplifier comprising:

a. a DC voltage source;

b. a first transistor having first, second and third electrodes, said first electrode supplied with an input signal to be amplified and said second electrode connected to said DC voltage source;

c. a first resistor, d. a load connected between said third electrode of said first transistor and a reference point through said first resistor;

e. a first capacitor;

f. first circuit means including a first diode and a second resistor connected in series between one side of said first capacitor and one side of said first resistor to supply a first DC voltage in proportion to a voltage across said first resistor to said first capacitor with one polarity;

g. second circiut means including a second diode and a third resistor connected in series between said one side of said first capacitor and said reference point to supply a second DC voltage in proportion the voltage acrosss said load to said first capacitor with the other polarity; and h. detecting means comprising a second transistor having first second and third electrodes, a third diode connected to said third electrode, said first and second electrodes of said second transistor connected across said first capacitor respectively, said third diode connected to said first electrode of said first transistor, and operative to substantially reduce the amplification of said first transistor in response to the voltage across said first capacitor.

* * * * *

Disclaimer 3,904,979.—*Tadao Suzuki*, Tokyo, Japan. PROTECTIVE CIRCUIT FOR TRANSISTOR AMPLIFIER. Patent dated Sept. 9, 1975. Disclaimer filed Oct. 20, 1975, by the assignee, *Sony Corporation.*

Hereby enters this disclaimer to claims 1, 2, 5 and 9 of said patent.

[*Official Gazette December 16, 1975.*]